United States Patent [19]

Cowley et al.

[11] Patent Number: 5,057,793

[45] Date of Patent: Oct. 15, 1991

[54] FREQUENCY SYNTHESIZER PLL HAVING DIGITAL AND ANALOG PHASE DETECTORS

[76] Inventors: Nicholas P. Cowley, 10 Summerhouse Road, Wroughton, Wiltshire, England; Thomas D. Stephen, 11 Lackey Road, Upper Ballindery, Lisburn, County Antrim, Ireland

[21] Appl. No.: 604,153

[22] Filed: Oct. 29, 1990

Related U.S. Application Data

[63] Continuation-in-part of Ser. No. 7/435,402, Nov. 13, 1989, abandoned.

[51] Int. Cl.$^5$ .................. H03L 7/087; H03L 7/091; H03L 7/095
[52] U.S. Cl. ...................... 331/1 A; 331/11; 331/14; 331/17; 331/27; 331/DIG. 2; 307/516; 328/134
[58] Field of Search ............ 331/1 A, 10, 11, 12, 331/14, 17, 25, 27, DIG. 2; 307/516; 328/133, 134

[56] References Cited

U.S. PATENT DOCUMENTS

| | | | |
|---|---|---|---|
| 4,107,623 | 8/1978 | Graf et al. | 331/1 A |
| 4,167,711 | 9/1979 | Smoot | 331/17 |
| 4,490,688 | 12/1984 | Borras et al. | 331/1 A |
| 4,803,705 | 2/1989 | Gillingham et al. | 331/1 A X |

Primary Examiner—Siegfried H. Grimm
Attorney, Agent, or Firm—Fleit, Jacobson, Cohn, Price, Holman & Stern

[57] ABSTRACT

A frequency synthesizer phase locked loop includes a voltage controlled oscillator (VCO) providing a variable frequency signal, a reference frequency oscillator providing a reference frequency signal, a phase comparison circuit for comparing the phases of the variable frequency and reference frequency signals and providing an output signal to a loop filter, the output of the loop filter providing a frequency control signal to the VCO. The phase comparison circuit includes a digital phase detector providing an output signal on an output line coupled to a charge pump for providing a first output signal to the loop filter; and an analog phase detector including a sample and hold circuit, and a control circuit responsive to the variable and reference frequency signals for providing a signal for sampling to the sample and hold circuit, the sample and hold circuit providing a second output signal to the loop filter. The analog phase detector includes a voltage detection circuit for detecting the voltage level of the signal held by the sample and hold circuit, and for selectively inhibiting the first output signal when the voltage is within predetermined limits.

5 Claims, 6 Drawing Sheets

FREQUENCY SYNTHESIZER PLL HAVING DIGITAL AND ANALOG PHASE DETECTORS

The application is a continuation-in-part of our prior application, U.S. Ser. No. 07/435,402 filed Nov. 13, 1989 in the names of Nicholas P. Cowley and Thomas D. McClelland, now abandoned.

FIELD OF THE INVENTION

The present invention relates to phase comparators for Frequency Synthesisers.

BACKGROUND ART

A signal having a desired frequency may be synthesised by a frequency synthesiser; frequency synthesisers have a local oscillator (L.O.) and may include a programmable or other divider, and the output of the local oscillator is locked in-phase to a reference source (typically a crystal type device the output of which may be divided by a reference divider). The local oscillator typically operates at several Megahertz or even Gigahertz while the frequency of the reference source is usually of the order of a few Kilohertz. Divided signals can then be phase compared in a phase detector which gives an output indicative of the phase imbalance of the divided signals. This allows frequency comparison by a digital function and so provides phase up or phase down error signal for use in controlling the local oscillator via an alteration of the applied voltage to a varactor diode.

A particular end product of such a frequency synthesiser is in the tuning circuit of a radio or television receiver. Conventionally, the phase detector is part of a phase and frequency comparator including a digital phase detector and an analogue phase detector. The digital detector has advantages in high frequency applications in which output pulses produced thereby are used to drive a charge pump circuit feeding or draining an integrating capacitor whose voltage is used to control a voltage dependant resonance element, such as a varactor diode, of a voltage controlled oscillator (VCO).

Digital phase detectors are inherently noisy and such method of VCO control can lead to considerable jitter on the output of the synthesiser.

SUMMARY OF THE INVENTION

It is an object of such frequency synthesisers to achieve a very pure L.O. signal, that is one with a low sideband spectrum whereby accurate frequency locking can be achieved.

Sidebands generated are of either a periodic nature caused by comparison frequency etc. leaking onto the varactor line, or fundamental system noise.

It is an object of the present invention to reduce the problems of sideband generation associated with the phase detectors in the synthesis loop.

It is a further object of the invention to provide a synthesiser which can simply be integrated onto a single chip.

According to the present invention there is provided a frequency synthesiser having a phase locked loop circuit including a voltage controlled oscillator (VCO) having a control input for receiving a frequency control signal and providing a variable frequency signal, a reference frequency oscillator providing a reference frequency signal, phase comparison means for comparing the phases of the variable frequency and reference frequency signals and provididng an output signal to a loop filter, the output of the loop filter providing said frequency control signal to the VCO;

and wherein said phase detector means comprises :

a digital phase detector providing an output signal on an output line means, said output line means being coupled to charge pump means for providing a first output signal to said loop filter;

an analogue phase detector including sample and hold means, and control means responsive to the variable frequency and reference frequency signals for providing a signal for sampling to the sample and hold means, the sample and hold means providing a second output signal to said loop filter, and including voltage detection means for detecting the voltage level of the signal held by said sample and hold means as within predetermined limits, for selectively inhibiting said first output signal.

As preferred, the output line means of said digital phase detector is coupled to said control means of said analogue phase detector, said control means being operative to convert the output signal of the digital phase detector to said signal for sampling, whereby said digital phase detector is comprised in said analogue phase detector. The advantage of such an arrangement is that the analogue detector relies upon the digital control detector for the initial phase comparison, and thereby avoids using MOS transistors which are commonly required in analogue detectors; the whole synthesiser may be implemented in bipolar technology as a single chip.

The analogue sample-and-hold phase detector may comprise a capacitor, current sources for charging and draining the capacitor in accordance with phase errors fed thereto, an amplifier to a first input of which the voltage on the capacitor is applied, a feedback path between the output of the amplifer and a second input thereto, and a second capacitor between the output of the amplifier and ground, the first capacitor serving to integrate the error signals fed thereto and the second capacitor serving to integrate the output from the amplifier, whereby the detector has a linear output when the phase errors are within a predetermined range.

BRIEF DESCRIPTION OF THE DRAWINGS

An embodiment of the present invention will now be described with reference to the accompanying drawings in which.

DESCRIPTION OF THE PREFERRED EMBODIMENT

Figure 1:
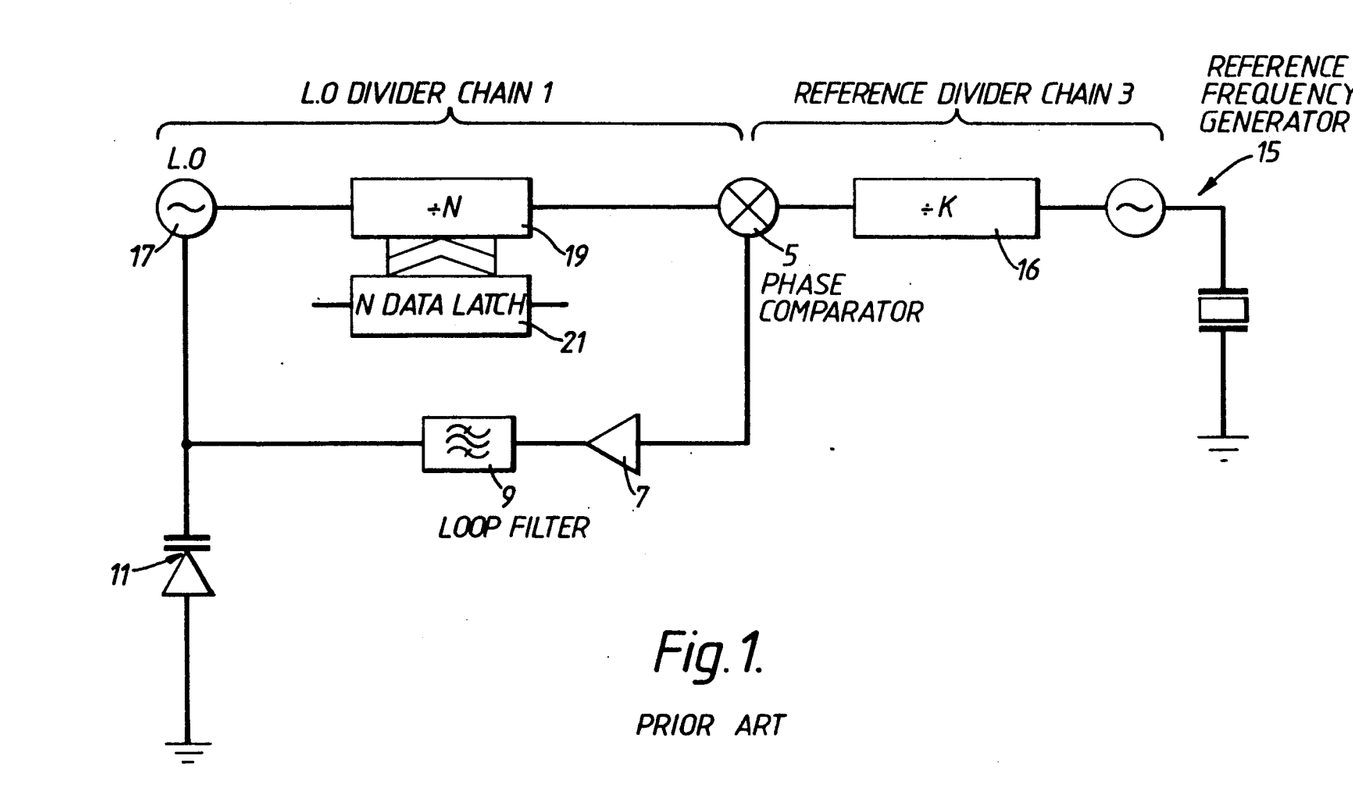
FIG. 1 is a schematic representation of a prior art frequency synthesiser.

FIG. 1 shows, in schematic form, a prior art frequency synthesiser arrangement. It can be seen that the arrangement comprises a local oscillator divider chain 1 and a reference divider chain 3 each feeding into a phase detector 5. The detector 5 outputs through an amplifier 7 and a filter 9. The detector 5 output is used to control the local oscillator through a varactor diode 11 therein.

The reference divider chain 3 comprises a reference frequency generator 15 providing a reference frequency which is divided in divider element 16. The divider element 16 divides the reference frequency by the operator K. The local oscillator chain comprises a local oscillator 17 which outputs a local oscillator frequency which is divided by a further divider element 19. The divider element 19 divides the oscillator frequency using a divisor N stored in a data latch 21. The output of phase detector 5, loop amplifier 7 and filter 9 is arranged to steer the LO 17 such that the phase and frequency of the two signals input to detector 5 are balanced with one another.

Figure 2A:
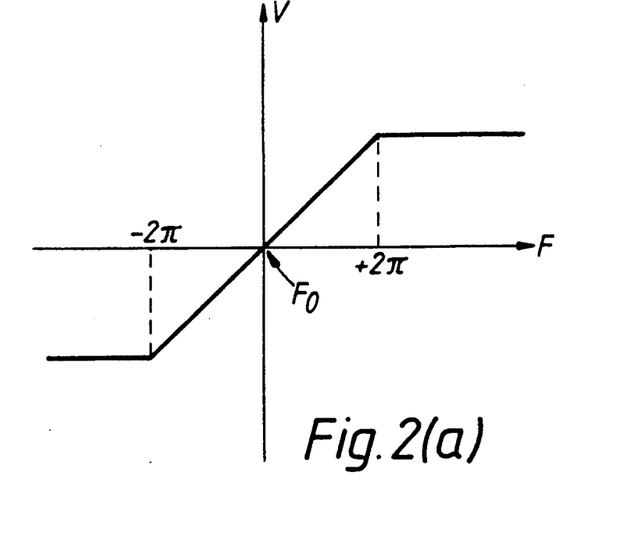
FIGS. 2a, 2b and 2c illustrate respectively, in graphical form, an ideal and a practical response and a response using a known solution to the distortion problem shown in FIG. 2b.
Figure 2B:
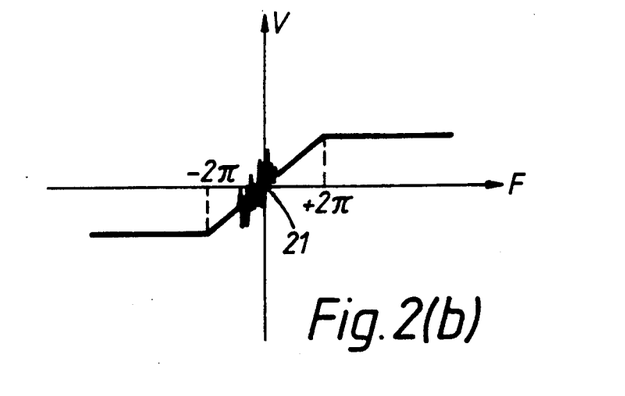
Figure 2C:
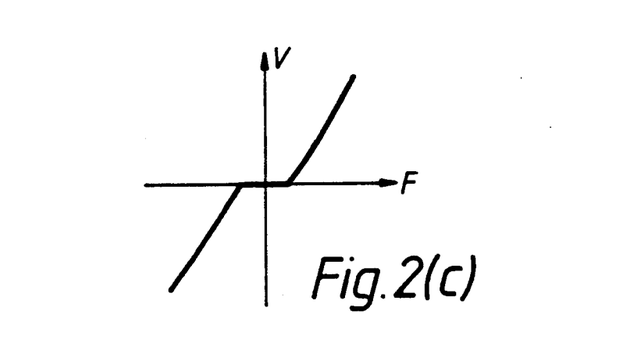

FIG. 2(a) illustrates an ideal frequency lock profile wherein the lock frequency $F_O$ is accurately positioned along the curve with no "band ripple" due to the phase detector arrangement of the detector 5. FIG. 2(b) illustrates a practical frequency response curve for a digital phase detector showing 'noise' associated with reset signals and differential delays causing ripple on the varactor control line. A solution FIG. 2(c) has been proposed to overcome this by further processing which introduces a step in the response over the region of imprecise resolution. However, this provides a 'dead zone' around lock which is disadvantageous.

Figure 3A:
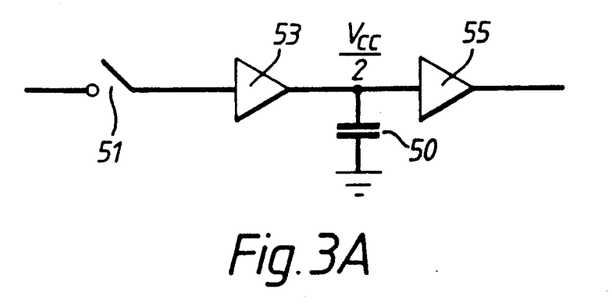
FIG. 3A is a schematic view of an analogue phase detector arrangement for achieving frequency lock.
Figure 3B:
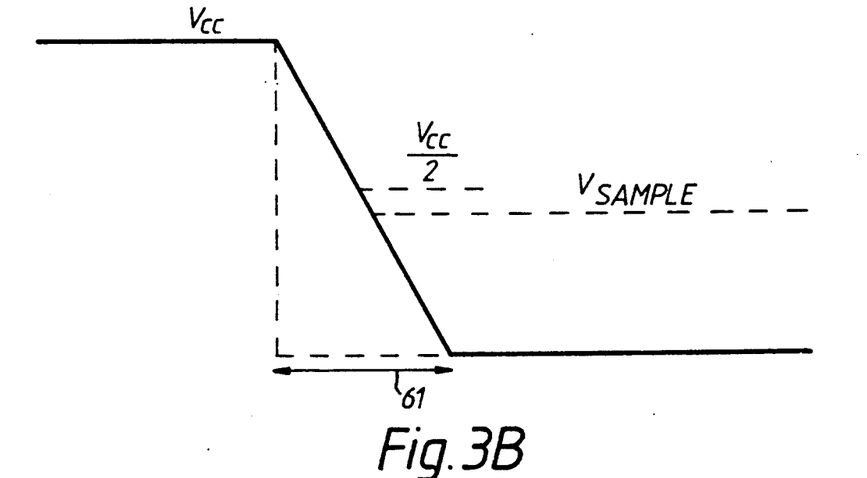
FIG. 3B is a graph for understanding operation of the detector of FIG. 3A.

Referring to FIG. 3A which shows an analogue phase detector, a capacitor 50 samples the voltage in the reference cycle under control of a switch 51. If the capacitor 50 is as near ideal as possible then there will be little leakage especially since buffers 53, 55 are provided. Thus, if the frequency lock condition corresponds to Vcc/2 (where Vcc is a rail voltage) (FIG. 3B) and this value is stored in capacitor 50 there will be little sag in the stored voltage value.

In practise, the capacitor will be discharged and charged repeatedly over a set time span with a constant consequential finite phase error.

The analogue sample and hold phase detector is most useful when the synthesiser is near to the frequency lock situation as in-band ripple due to the digital detector may be eliminated. There is no ripple or dead band with the analogue s/h detector as the voltage on the capacitor 50 varies smoothly and continuously and, if the detector is in a stable state, this value is preferably Vcc/2.

In an embodiment of the present invention, the digital detector is switched off when the synthesiser approaches frequency lock to avoid the generation of digital noise in the loop.

Figure 4:
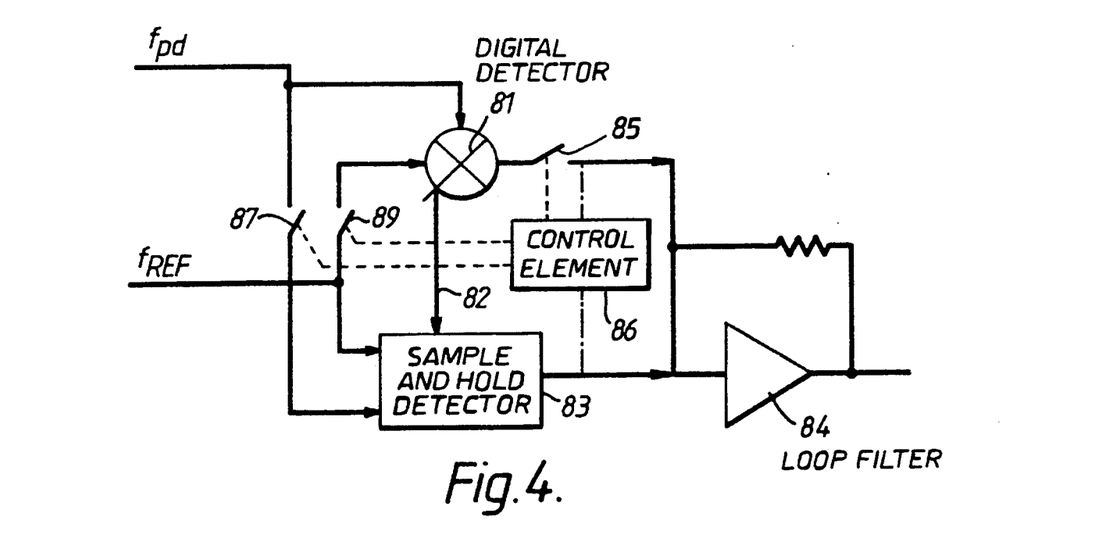
FIG. 4 illustrates in schematic form a phase detector for achieving frequency lock according to an embodiment of the present invention.

In the embodiment of the present invention shown in FIG. 4, it will be appreciated that summing of the outputs of the digital and analogue phase detectors occurs, but once the summation enters the linear section 61 (see FIG. 3B) of the stored voltage-with-frequency curve of the capacitor 50, the digital phase detector is disabled. Consequently, noise problems associated with this digital phase detector are removed as is the dead zone.

It will be appreciated that the present invention couples the speed of digital detectors in approaching frequency lock with the inherently less noisy analogue type detectors such as sample-and-hold.

Signals from the reference source fref and the local oscillator fpd are initially directed as stated above, in parallel to a digital detector 81 and an analogue sample-and-hold detector 83. Output signals from respective detectors 81 and 83 are directed to a loop filter 84 whereby the control voltage of the local oscillator can be adapted. The sample-and-hold detector 83 additionally includes threshold voltage detection means for providing a signal on line 82 to disable the digital detector 81 when the value of the S/H detector 83 approximates the preferred pre-determined value of Vcc/2. Switches 85, 87 and 89 may be added such that the digital detector may be disabled as follows:

(i) By opening switch 85; or
(ii) By closing switches 87 and 89 and opening switch 85;

Operation of switches 85, 87 and 89 may be controlled by a control element 86 which detects approach of the Vcc/2 condition.

Figure 5:
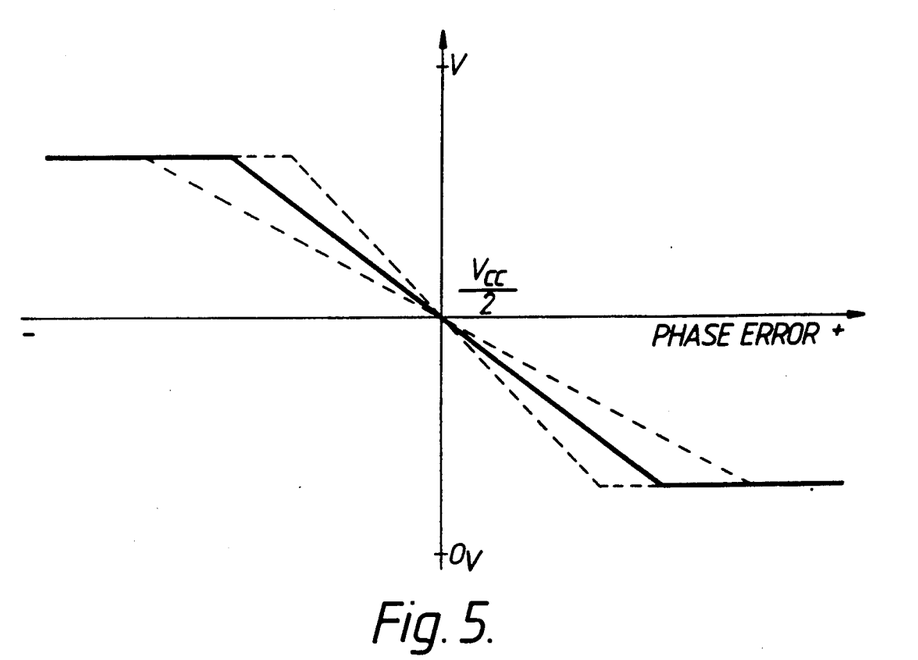
FIG. 5 is a graphical representation of output voltage against phase error of a phase detector according to a preferred embodiment of the present invention.
Figure 6:
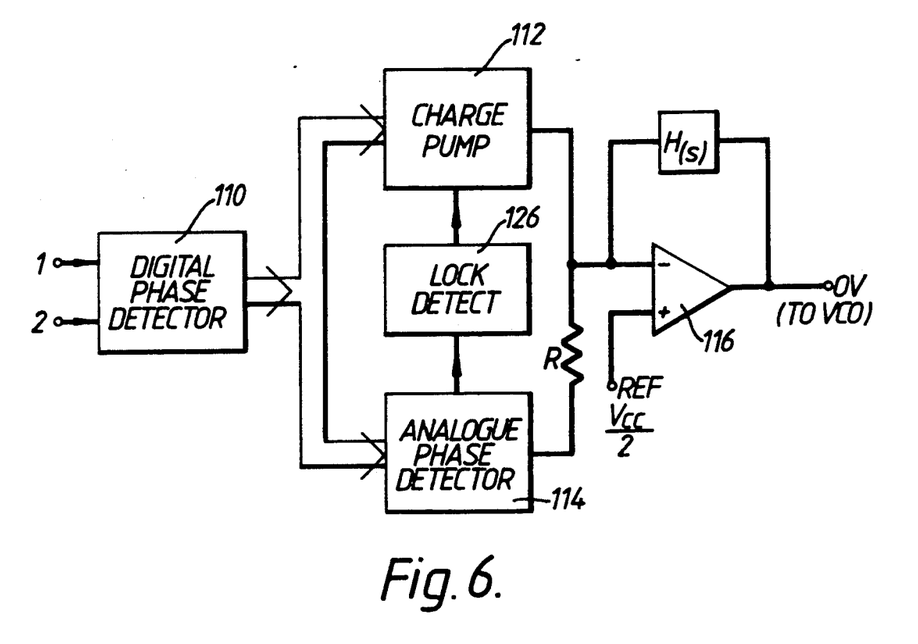
FIG. 6 is a block diagram of a combined phase detector incorporating the preferred analogue phase detector.

Referring now to FIGS. 5 to 7B of the drawings, there is shown in FIG. 6 a combined phase detector incorporating an analogue phase detector in accordance with a further preferred embodiment of the present invention. The combined phase detector comprises a digital phase detector 110 arranged to receive signals at frequencies $F_1$ and $F_2$. One of these frequencies is derived from the output of a voltage controlled oscillator (VCO) 17 (FIG. 1) and the other frequency is derived from a stable source such as a crystal oscillator 15 (FIG. 1 also). The digital detector 110 may be of conventional form and serves to provide phase up or phase down output signals when signals of a first of the frequencies lead or lag the signals from the other frequency source. The output phase error signals are fed to a charge pump 112 and to an analogue phase detector 114 in accordance with the preferred embodiment of the present invention. The charge pump 112 pumps current into or drains current from an integrating capacitor (not shown but forming part of the charge pump circuit). The output of the charge pump circuit is fed to a loop filter comprising a buffer amplifier 116 having variable feedback $H_s$ and hence to the VCO 11 (FIG. 1). A reference voltage (equal to Vcc/2) is differentially fed to the buffer amplifier 116 so that the output signal thereupon is dependant upon the difference between the voltage on the integrating capacitor and the reference voltage Vcc/2.

The output (the phase error signal) from the digital phase detector 110 is also fed to the analogue phase detector 114.

Figure 7A:
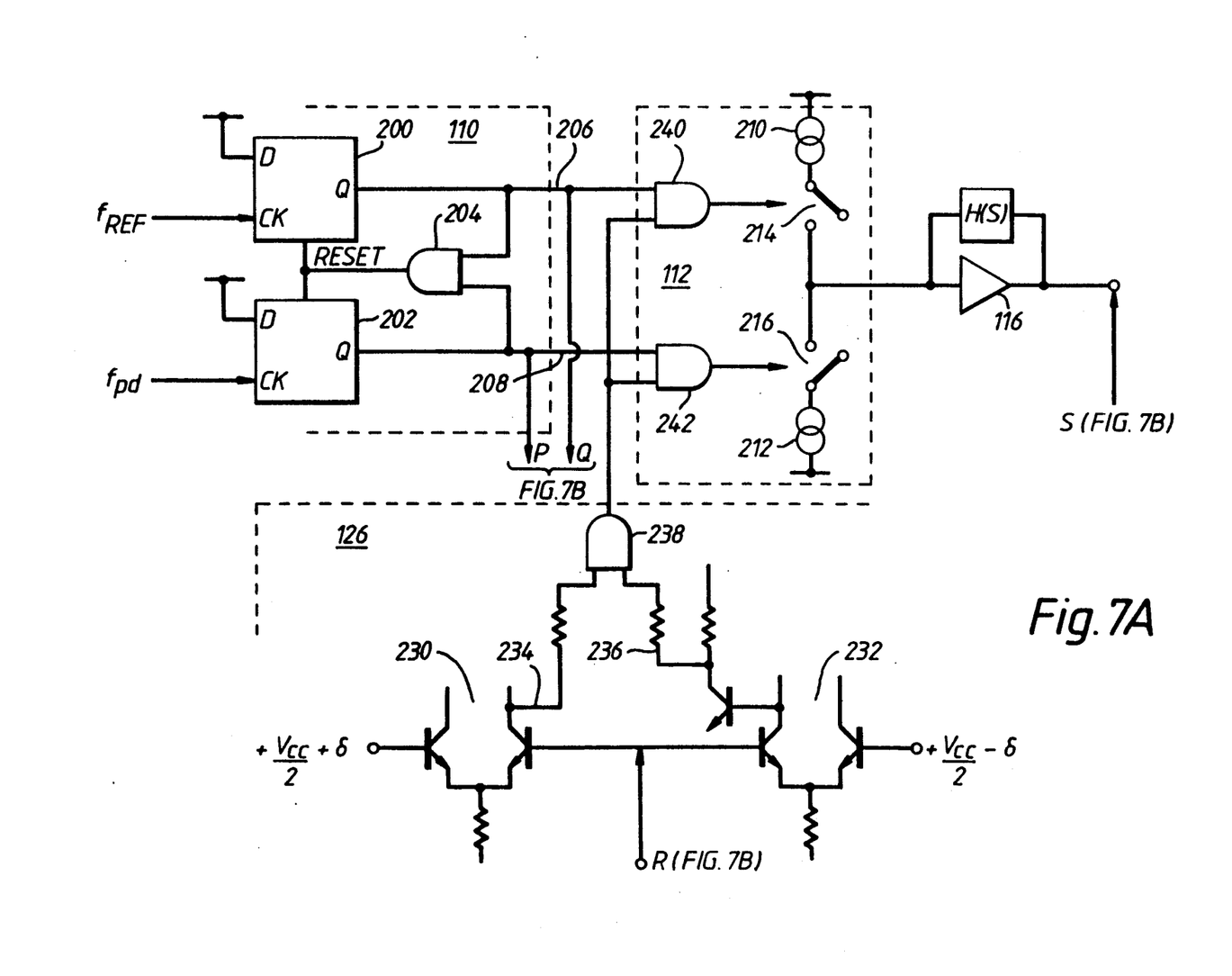
FIGS. 7A, 7B are a more detailed block diagram of the arrangement of FIG. 6.
Figure 7B:
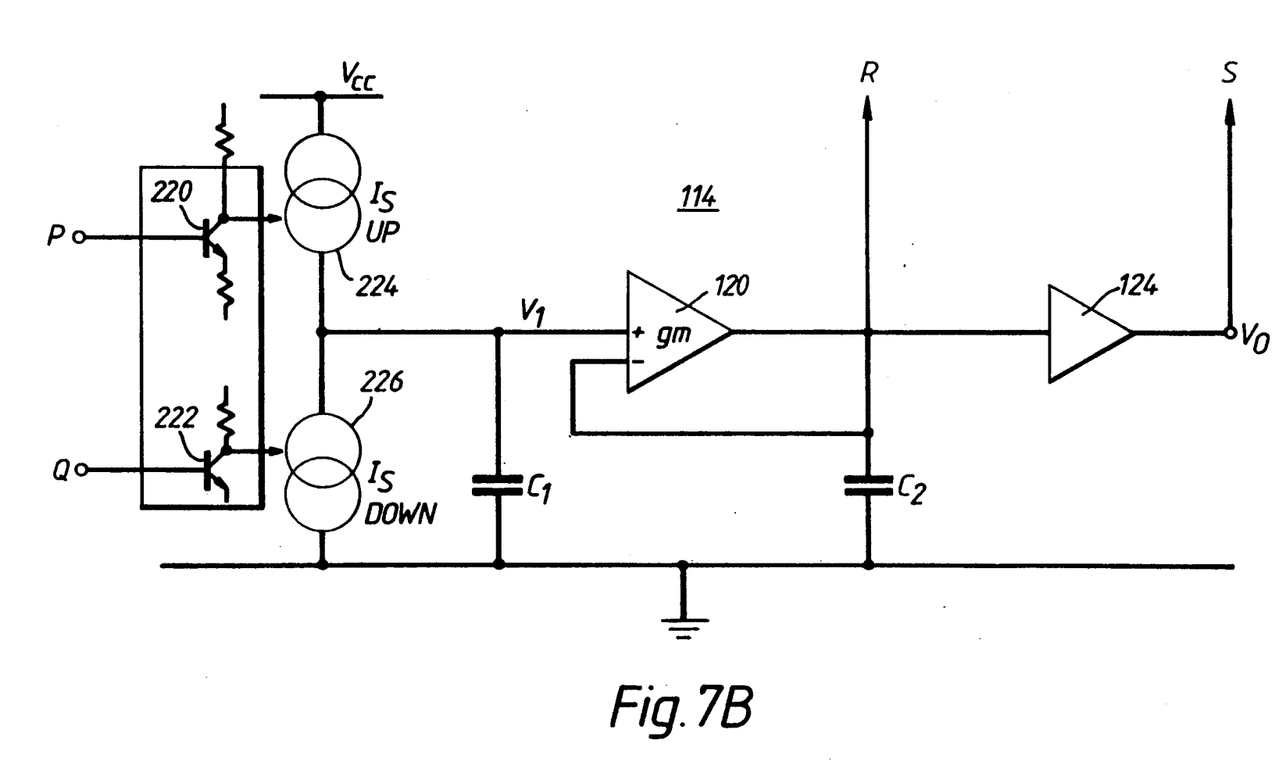

Referring now to FIGS. 7A and 7B which show the circuit of FIG. 6 in more detail, digital detector 110 comprises first and second D type flip-flops 200, 202 to which the signals $f_{ref}$ and $f_{pd}$ are applied. The Q outputs of the flip-flops are coupled to an AND gate 204 which applies a reset signal to both flip-flops. Thus the result of this arrangement is for a pulse of variable width to appear on either Q output of the two flip-flops depending on the phase relationships of the input signals. The output signals are applied on lines 206, 208 to a charge pump circuit 112 which comprises current sources 210, 212 which are coupled via switches 214, 216 to loop filter 116. Switches 214 and 216 are controlled by the signals on lines 206, 208. The control signals on lines 206, 208 are also applied to the control device A (see FIG. 7B) of the sample-and-hold arrangement and are applied via switching transistors 220, 222 to current sources 224, 226 in order to provide appropriate charging of the sample-and-hold capacitors. It should be noted that the control signals provided by the digital phase detector define the sampling period and there is no necessity to provide a separate switching under the control of a clock for controlling the sampling for the capacitors. The output S of the circuit of FIG. 7B is applied to the loop filter 116 and a further output is taken from point R for control of a lock detect circuit 126 as shown in FIG. 7A. In circuit 126, first and second differential pairs 230, 232 have the signal existing on capacitor $C_2$ applied to a control input. Threshold voltages $V_{cc}/2+d$ and $V_{cc}/2-d$ are applied to the other control inputs of the differential pairs in order to provide threshold levels so that outputs taken from the differential pairs at 234, 236 and applied to an AND gate 238, are used to selectively disable charge pump circuit 112 by disabling AND gates 240, 242.

It will be understood in this arrangement that the construction of the analogue phase detector is simplified in that the phase detection process is provided by the digital phase detector and the analogue part merely comprises the sample-and-hold arrangement, which however requires no separate switching for sampling. Among other advantages, this enables the sample-and-hold arrangement to be fabricated on the same chip as the digital phase detector since it is common for sample-and-hold phase detectors to be fabricated with high impedance MOS transistors, whereas the arrangement shown can be fabricated with bipolar NPN transistors.

Referring particularly to FIG. 7B it will be seen that the phase error signal is input to a controller A which sets current levels of and is arranged to switch on and off current sources $I_s$ (up) and $I_s$ (down). A capacitor $C_1$ is charged or drained in dependance upon which of the current sources is switched on. The voltage $V_1$ on the capacitor $C_1$ is fed to an amplifier 120 having a feedback loop paralleled by a second capacitor $C_2$. The output of the amplifer 120 is buffered by buffer amplifier 124 (which may be the same amplifier as the amplifier 116 of FIG. 7A or which may feed the amplifier 116 of FIG. 7A).

It can be shown that, if $\phi$ is the phase error then over one reference cycle, the voltage on the capacitor $C_1$ is:

$$V_i = \frac{1}{C_1} \int_0^{t_1} I_s dt \quad (1)$$

where $$t_1 = \frac{\phi}{2\pi f_{ref}} \text{ and } f_{ref}$$

is the frequency of the reference source (or its quotient) After integration:

$$V_i = \frac{I_s}{C_1} \cdot \frac{\phi}{2\pi f_{ref}} \quad (11)$$

and the gain, in volts/radian, $$= K_\phi = \frac{V_i}{\phi} = \frac{I_s}{2\pi f_{ref} C_1}$$

It can be also shown that the output voltage $$V_o = \frac{gm}{SC_2 + gm} V_i$$

where gm is the mutual conductance of the amplifier 120 and $SC_2$ is the Laplace transform for the capacitance $C_2$.

The overall gain for the amplifier 120 in volts/radian then equals.

$$K_\phi = \frac{V_0}{\phi} = \left(\frac{gm}{SC_2 + gm}\right) \cdot \left(\frac{I_s}{2\pi f_{ref} C_1}\right)$$

Referring to FIG. 5 it will be seen that the slope of the graph ($K_{100}$) is variable. The response is linear for small errors but limits when the phase error becomes too large. By appropriately adjusting the gain e.g. by adjusting the values of $C_1$ and $C_2$, an optimum value of slope may be selected. Over the chosen range, the output $V_o$ will vary linearly with phase error.

A lock detector 126 is provided. The lock detector is sensitive to the output voltage of the analogue detector 114. At values of $V_o$ within the chosen linear range of the detector 114, the lock detector is enabled and serves to disable the charge pump 112. The output of the detector 114 is then used to control the VCO. Any jitter or noise originating in the digital phase detector 110 is smoothed out, to a great extent, by the capacitors of the analogue detector 114.

The invention is not confined to the precise details of the foregoing example and variations may be made thereto. For example, the analogue phase detector 114 of FIG. 7B may be used in other circuits than that shown in FIG. 7A (For example, FIG. 4). It will be appreciated that other feedback arrangements may be applied to the amplifier 120 of FIG. 7B or to the amplifier 116 of FIG. 6.

Other variations are possible within the scope of the present invention, as defined by the appended claims.

We claim:

1. A frequency synthesiser having a phase locked loop circuit including a voltage controlled oscillator (VCO) having a control input for receiving a frequency control signal and providing a variable frequency signal, a reference frequency oscillator providing a reference frequency signal, phase comparison means for comparing the phases of the variable frequency and reference frequency signals and providing an output signal to a loop filter, the output of the loop filter providing said frequency control signal to the VCO;

and wherein said phase detector means comprises :
a digital phase detector providing an output signal on an output line means, said output line means being coupled to charge pump means for providing a first output signal to said loop filter;
an analogue phase detector including sample and hold means, and control means responsive to the variable frequency and reference frequency signals for providing a signal for sampling to the sample and hold means, the sample and hold means providing a second output signal to said loop filter, and including voltage detection means for detecting the voltage level of the signal held by said sample and hold means as within predetermined limits, for selectively inhibiting said first output signal.

2. A synthesiser as claimed in claim 1 wherein the output line means of said digital phase detector is coupled to said control means of said analogue phase detector, said control means being operative to convert the output signal of the digital phase detector to said signal for sampling, whereby said digital phase detector is comprised in said analogue phase detector.

3. A synthesiser as claimed in claim 1 wherein said output line means comprises first and second output lines and said digital phase detector is operative to provide output pulses of variable width on the first and second output lines, said charge pump means including a first current source of a first polarity, a first switch means coupled to the first output line for selectively switching the first current source, and a second current source of a second polarity, a second switch means coupled to the second output line for selectively switching the second current source;

and said analogue phase detector including a first current source of a first polarity, a second current source of a second polarity and switch means coupled to said first and second output lines for selectively switching the first and second current sources.

4. A synthesiser as claimed in claim 1 wherein the analogue phase detector comprises a capacitor, current sources for charging and draining the capacitor in accordance with phase errors fed thereto, an amplifier to a first input of which the voltage on the capacitor is applied, a feedback path between the output of the amplifier and a second input thereto, and a second capacitor between the output of the amplifier and ground, the first capacitor serving to integrate the error signals fed thereto and the second capacitor serving to integrate the output from the amplifier, whereby the detector has a linear output when the phase errors are within a predetermined range.

5. A synthesiser as claimed in claim 4 further including a buffer amplifier for buffering the integrated output of the first amplifier.

* * * * *